United States Patent
Hsu et al.

(10) Patent No.: US 6,583,000 B1
(45) Date of Patent: Jun. 24, 2003

(54) PROCESS INTEGRATION OF $SI_{1-x}GE_x$ CMOS WITH $SI_{1-x}GE_x$ RELAXATION AFTER STI FORMATION

(75) Inventors: Sheng Teng Hsu, Camas, WA (US); Jong-Jan Lee, Camas, WA (US); Jer-shen Maa, Vancouver, WA (US); Douglas James Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/072,183

(22) Filed: Feb. 7, 2002

(51) Int. Cl.[7] .......................................... H01L 21/8238
(52) U.S. Cl. ...................... 438/222; 438/221; 438/430; 438/528; 438/692
(58) Field of Search ................................ 438/221, 222, 438/430, 528, 692

(56) References Cited

U.S. PATENT DOCUMENTS

| | | | | |
|---|---|---|---|---|
| 4,994,866 A | * | 2/1991 | Awano | 257/190 |
| 5,891,769 A | * | 4/1999 | Liaw et al. | 438/167 |
| 6,313,016 B1 | * | 11/2001 | Kibbel et al. | 438/478 |
| 6,464,780 B1 | | 10/2002 | Mantl et al. | 117/90 |
| 6,515,335 B1 | * | 2/2003 | Christiansen et al. | 257/347 |
| 2002/0185686 A1 | * | 12/2002 | Christiansen et al. | 257/347 |

OTHER PUBLICATIONS

Welser et al., *Strain dependence of the performance enhancement in strained–Si n–MOSFETs*, IEDM Conference Proceedings, p. 373 (1994).

Rim et al., *Enhanced hole mobilities in surface–channel strained–Si p–MOSFETs*, IEDM Conference Proceedings, p. 517 (1995).

Nayak et al., *High–mobility Strained–Si PMOSFETs*, IEEE Transactions on Electron Devices, vol. 43, 1709 (1996).

H. Trinkaus et al, *Strain relaxation mechanism for hydrogen–implanted $Si_{1-x}Ge_x/Si(100)$ heterostructures*, Appl. Phys. Lett., 76, 3552, (2000).

Höck et al., *High hole mobility in $Si_{0.17}Ge_{0.83}$ channel metal–oxide–semiconductor field–effect transistors grown by plasma–enhanced chemical vapor deposition*, Applied Physics letter, 76, 3920, (2000).

\* cited by examiner

*Primary Examiner*—Trung Dang
(74) *Attorney, Agent, or Firm*—David C. Ripma; Matthew D. Rabdau; Scott C. Krieger

(57) ABSTRACT

A method of forming a CMOS device includes preparing a silicon substrate, including forming plural device regions on the substrate; epitaxially forming a strained SiGe layer on the substrate, wherein the SiGe layer has a germanium content of between about 20% and 40%; forming a silicon cap layer epitaxially on the SiGe layer; depositing a gate oxide layer; depositing a first polysilicon layer; implanting H+ ions to a depth below the SiGe layer; forming a trench by shallow trench isolation which extends into the substrate; annealing the structure at a temperature of between about 700° C. to 900° C. for between about five minutes to sixty minutes; depositing an oxide layer and a second polysilicon layer, thereby filling the trench; planarizing the structure to the top of the level of the portion of the second polysilicon layer which is located in the trench; and completing the CMOS device.

21 Claims, 3 Drawing Sheets

PROCESS INTEGRATION OF SI$_{1-x}$GE$_X$ CMOS WITH SI$_{1-x}$GE$_X$ RELAXATION AFTER STI FORMATION

RELATED APPLICATION

This application is related to Ser. No. 10/062,319, filed Jan. 31, 2002 for Method to form relaxed SiGe layer with high Ge content, and to Ser. No. 10/062,336, filed Jan. 31, 2002 for Method to form thick relaxed SiGe layer with trench structure.

FIELD OF THE INVENTION

This invention relates to high speed CMOS integrated circuits, and specifically to a method of SiGe relaxation and shallow trench isolation which is suitable for commercial CMOS production.

BACKGROUND OF THE INVENTION

SiGe relaxation after shallow trench isolation (STI) has been proposed to reduce defect density and junction leakage current.

In enhanced mobility MOSFET device applications, thick, relaxed Si$_{1-x}$Ge$_x$ buffer layers have been used as virtual substrates for thin strained silicon layers to increase carrier mobility for NMOS devices, as reported by Welser et al., Strain dependence of the performance enhancement in strained-Si n-MOSFETs, IEDM Conference Proceedings, p. 373 (1994); Rim et al., Enhanced hole mobilities in surface-channel strained-Si p-MOSFETs, IEDM Conference Proceedings, p. 517 (1995); and Nayak et al., High-mobility Strained-Si PMOSFETs, IEEE Transactions on Electron Devices, Vol. 43, 1709 (1996).

Höck et al., High hole mobility in Si$_{0.17}$Ge$_{0.83}$ channel metal-oxide-semiconductor field-effect transistors grown by plasma-enhanced chemical vapor deposition, Applied Physics letters, 76, 3920, 2000, report fabrication of a p-MOSFET on a stained relieved SiGe buffer.

H. Trinkaus et al, Strain relaxation mechanism for hydrogen-implanted Si$_{1-x}$Ge$_x$/Si(100) heterostructures, Appl. Phys. Lett., 76, 3552, 2000, have reported the advantages of using hydrogen implantation to increase the degree of SiGe relaxation and to reduce the density of threading dislocation. However, a relaxation of a SiGe layer of between 2000 Å and 2500 Å was reported. A SiGe layer of such thickness is not sufficient for commercial device application. Likewise, the other reports of CMOS devices on strained relieved SiGe layers do not provide techniques which are commercially viable.

SUMMARY OF THE INVENTION

A method of forming a CMOS device includes preparing a silicon substrate, including forming plural device regions on the substrate; epitaxially forming a strained SiGe layer on the substrate, wherein the SiGe layer has a germanium content of between about 20% and 40%; forming a silicon cap layer epitaxially on the SiGe layer; depositing a gate oxide layer; depositing a first polysilicon layer; implanting H+ ions to a depth below the SiGe layer at a dose of between about $1 \times 10^{16}$cm$^{-2}$ to $4 \times 10^{16}$cm$^{-2}$, and at an energy level properly adjusted to have a projected depth of between about 2 nm to 100 nm deeper than the SiGe:silicon interface. For a layer of SiGe having a thickness of about 300 nm, the hydrogen ion energy level is between about 40 keV to 80 keV. The method of the invention further includes forming a trench by shallow trench isolation, which extends into the substrate; annealing the structure at a temperature of between about 700° C. to 900° C. for between about five minutes to sixty minutes to relax the strained SiGe layer; depositing an oxide layer and a second polysilicon layer, thereby filling the trench; planarizing the structure to the top of the level of the portion of the second polysilicon layer which is located in the trench; and completing the CMOS device.

It is an object of this invention to provide a process integration flow on a CMOS Si$_{1-x}$Ge$_x$ device for high speed integration circuit.

Another object of the invention is to fabricate a CMOS Si$_{1-x}$Ge$_x$ device using STI which does not have a notch at the SiGe active edge.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTIONS OF THE PREFERRED EMBODIMENTS

Figure 1:
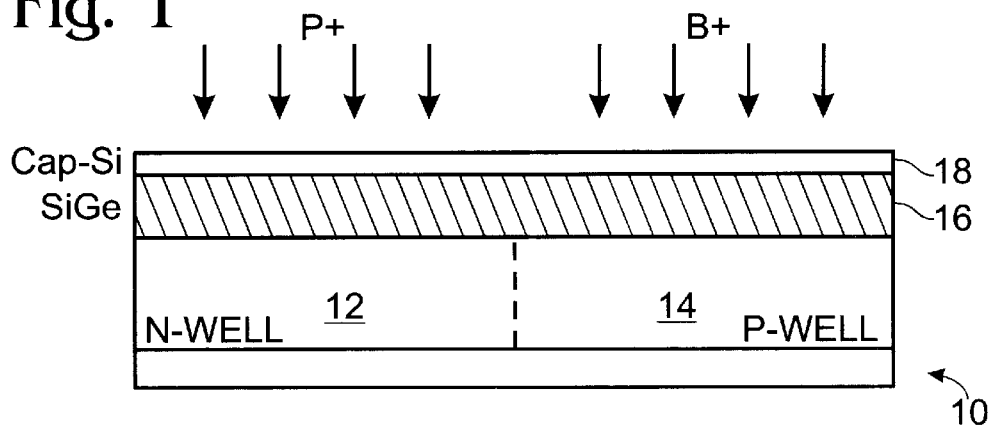
FIGS. 1–9 depicts steps in the method of the invention.

The method of the invention provides a commercially viable integration scheme to make CMOS devices incorporating SiGe layers functional. Referring initially to FIG. 1, a substrate is prepared, wherein the substrate may be either N-type silicon or P-type silicon, and which includes an N-well 12 and a P-well 14. A SiGe epitaxial layer 16 is grown on the substrate to a thickness of between about 2500 Å to 4000 Å. The strained SiGe layer has a germanium content of between about 20% to 40%. Another layer of silicon, referred herein as a cap silicon layer 18, is epitaxially grown to a thickness of between about 50 Å to 300 Å. The next step includes well ion implantation, which, in the preferred embodiment, includes implantation of phosphorus ions to form N-well 12, at a dose of about $2 \cdot 10^{13}$cm$^{-2}$ to $5 \cdot 10^{14}$cm$^{-2}$, at an energy level of between about 40 keV to 200 keV, and implantation of boron ions to form P-well 14, at a dose of about $2 \cdot 10^{13}$cm$^{-2}$ to $5 \cdot 10^{14}$cm$^{-2}$, at an energy level of 20 keV to 80 keV.

Figure 2:
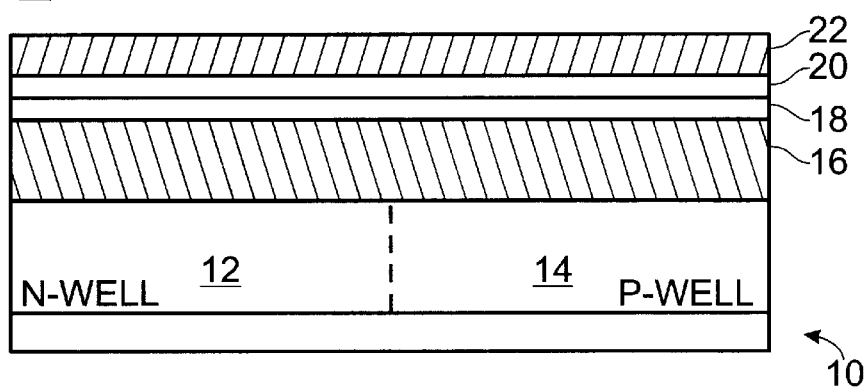

As shown in FIG. 2, a layer of gate oxide 20 is grown on the structure by CVD, to a thickness of between about 10 Å and 60 Å, and a first layer of polysilicon 22 is grown on the gate oxide by CVD to a thickness of between about 1000 Å to 3000 Å.

Figure 3:
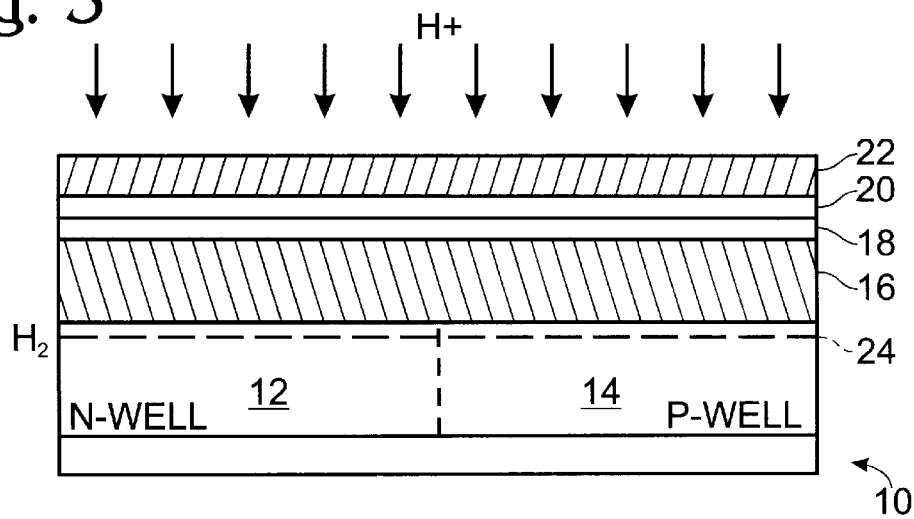
Figure 4:
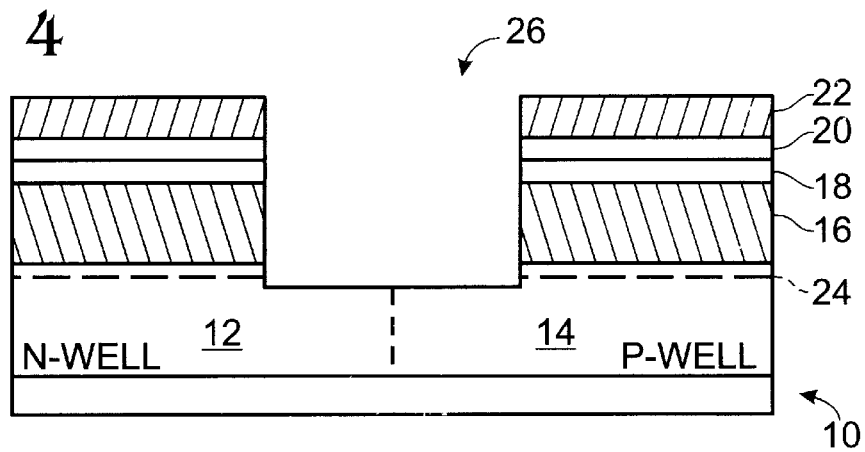

Turning to FIG. 3, hydrogen ions are implanted in a heavy dose, which is in the order of $1 \times 10^{16}$cm$^{-2}$ to $4 \times 10^{16}$cm$^{-2}$. The hydrogen ions are implanted at an energy level properly adjusted to have a projected depth of between about 2 nm to 100 nm deeper than the SiGe:silicon interface, which is a projected depth slightly deeper than the lower margin of the strained Si$_{1-x}$Ge$_x$ layer, as indicated by dashed line 24. For a layer of SiGe having a thickness of about 300 nm, the hydrogen ion energy level is between about 40 keV to 80 keV FIG. 4 depicts a shallow trench isolation (STI) etch, which forms a trench 26, and which may be a single step etch or a two step etch. Trench 26 has a depth of between about 3000 Å and 5000 Å, which is sufficient to extend the trench through the SiGe layer into the N-well and P-well. In the case of a two step etch, the polysilicon layer is etched first, and then the silicon STI trench is formed by etching. The SiGe layer is relaxed by annealing at a temperature of between about 700° C. to 900° C. for between about 5 minutes to 60 minutes. A trench sidewall liner is oxidized, preferably by rapid thermal oxidation (RTO), which step may be done simultaneously with the SiGe relaxation anneal.

Figure 5:
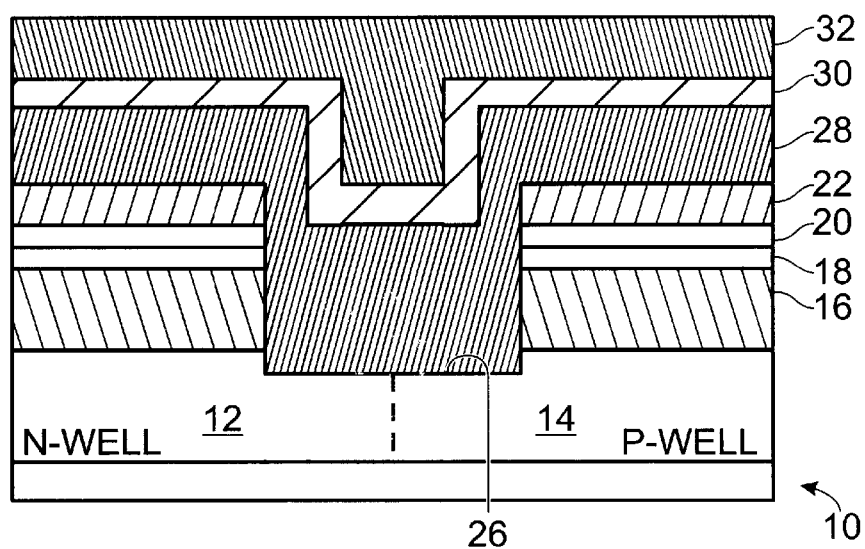
Figure 6:
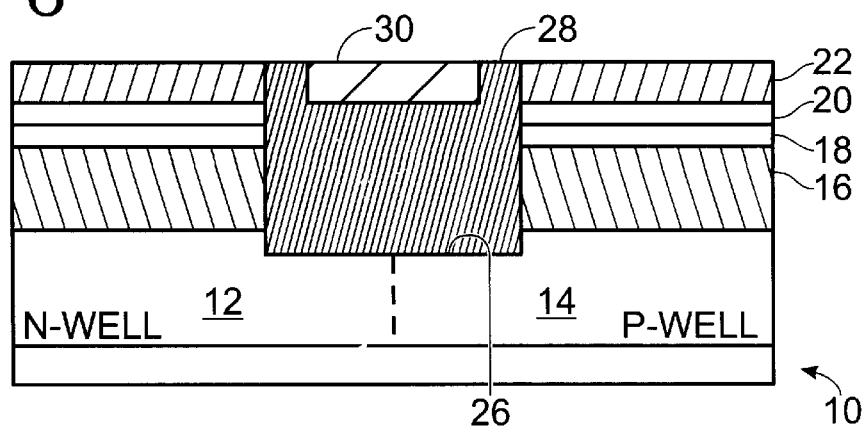

As shown in FIG. 5, the STI trench is filled with oxide 28 by CVD, and a second polysilicon layer 30 is deposited by CVD and planarized. An oxide layer 32 is deposited on second polysilicon layer 30. FIG. 6 depicts a two-step chemical mechanical polishing (CMP) wherein a low selectivity blanket CMP is used on oxide layer 32 in the STI trench and a high selectivity CMP is used on oxide layer 32 in trench 26, and on second polysilicon layer 30, stopping at the level of the second polysilicon layer in trench 26.

Figure 7:
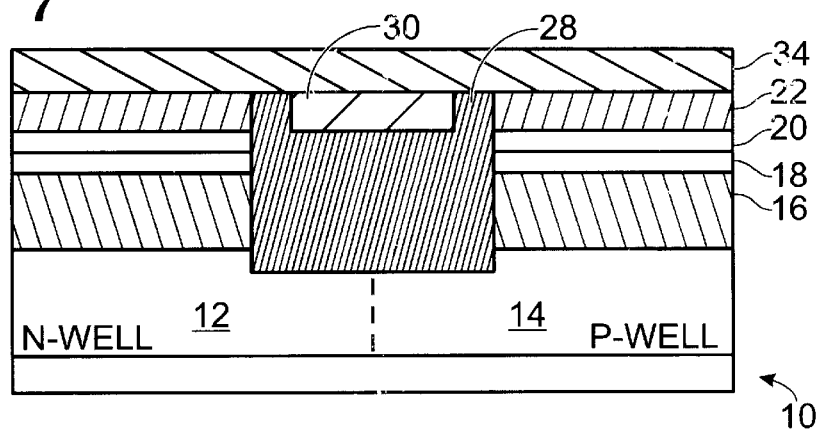
Figure 8:
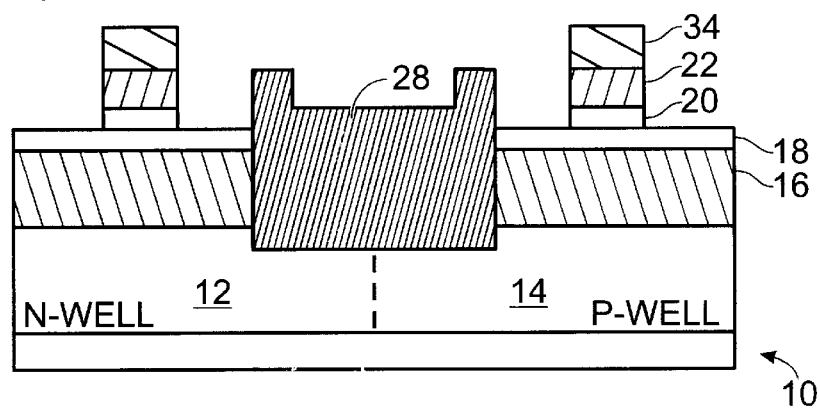
Figure 9:
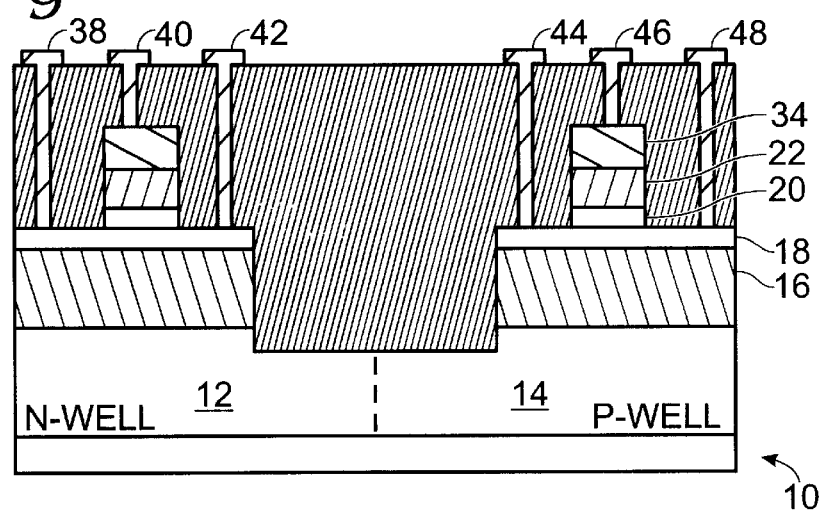

Referring to FIG. 7, a third polysilicon layer 34 is deposited. Polysilicon layer 34 is masked and the structure etched to the level of cap-silicon layer 16, as shown in FIG. 8, and standard CMOS device fabrication techniques are performed, including LDD, halo, source/drain ion implantation, gate spacer formation, etc. The device is finally completed, as shown in FIG. 9, by interlayer dielectric (ILD) deposition 36, which, in the preferred embodiment, is an oxide layer, contact masking and etching, and metalization of electrodes 38, 40, 42, 44, 46 and 48.

The STI process of the method of the invention has significant advantages over conventional prior art STI techniques. The gate oxide is grown before the STI trench is etched into the surface, which provides a flat surface for the formation of the STI trench. The growth of the STI sidewall oxide slightly thickens the gate oxide at the edge of the STI trench. A conventional STI process produces a notch at the STI active edge, which, because the silicon cap is very thin, will cut into the SiGe layer, which will result in the gate oxide being grown into the SiGe layer at the edge of the active device area. The STI method of the invention does not produce this notch, and therefore provides better gate oxide reliability than the prior art, conventional STI process.

Thus, a method of process integration of $Si_{1-x}Ge_x$ CMOS with $Si_{1-x}Ge_x$ relaxation after STI formation has been disclosed. It will be appreciated that further variations and modifications thereof may be made within the scope of the invention as defined in the appended claims.

We claim:

1. A method of forming a CMOS device, comprising:
   preparing a silicon substrate, including forming plural device regions on the substrate;
   epitaxially forming a strained SiGe layer on the substrate, wherein the SiGe layer has a germanium content of between about 20% and 40%;
   forming a silicon cap layer epitaxially on the SiGe layer;
   depositing a gate oxide layer;
   depositing a first polysilicon layer;
   implanting H+ ions to a depth below a SiGe:silicon interface;
   forming a trench by shallow trench isolation which extends into the substrate;
   annealing the structure at a temperature of between about 700° C. to 900° C. for between about five minutes to sixty minutes to relax the strained SiGe layer;
   depositing an oxide layer and a second polysilicon layer, thereby filling the trench;
   planarizing the structure to the top of the level of the portion of the second polysilicon layer which is located in the trench; and
   completing the CMOS device.

2. The method of claim 1 wherein said preparing a substrate includes forming an N-well and a P-well in each device region.

3. The method of claim 2 wherein said forming an N-well and a P-well in each device region includes implanting phosphorus ions to form the N-well at a dose of about $2 \cdot 10^{13}$ $cm^{-2}$ to $5 \cdot 10^{14} cm^{-2}$, at an energy level of 40 keV to 200 keV, and implanting boron ions to from the P-well at a dose of about $2 \cdot 10^{13}$ $cm^{-2}$ to $5 \cdot 10^{14} cm^{-2}$, at an energy level of 20 keV to 80 keV.

4. The method of claim 1 wherein said epitaxially forming a strained SiGe layer includes depositing a layer of strained SiGe to a thickness of between about 2500 Å to 4000 Å.

5. The method of claim 1 wherein said forming a cap silicon layer includes forming a cap silicon layer to a thickness of between about 50 Å to 300 Å.

6. The method of claim 1 wherein said forming a trench is a single-step etch.

7. The method of claim 1 wherein said forming a trench is a two-step etch which includes etching the first polysilicon layer and then etching the underlying layers into the substrate.

8. The method of claim 1 wherein said implanting H+ ions includes implanting H+ ions to a projected depth of between about 2 nm to 100 nm below the SiGe:silicon interface.

9. The method of claim 8 wherein said implanting H+ ions includes implanting H+ ions at a dose of between about $1 \times 10^{16} cm^{-2}$ to $4 \times 10^{16} cm^{-2}$, and at an energy of between about 40 keV to 80 keV.

10. A method of forming a CMOS device, comprising:
    preparing a silicon substrate, including forming plural device regions on the substrate;
    epitaxially forming a strained SiGe layer on the substrate, wherein the SiGe layer has a germanium content of between about 20% and 40% and a thickness of between about 2500 Å to 4000 Å, and which forms a SiGe:silicon interface with the silicon substrate;
    forming a silicon cap layer epitaxially on the SiGe layer;
    depositing a gate oxide layer;
    depositing a first polysilicon layer to a thickness of between about 1000 Å and 3000 Å;
    implanting H+ ions to a depth below the SiGe:silicon interface;
    forming a trench by shallow trench isolation which extends into the substrate;
    annealing the structure at a temperature of between about 700° C. to 900° C. for between about five minutes to sixty minutes, wherein said annealing also provides for liner oxidation of the trench sidewall;
    depositing an oxide layer and a second polysilicon layer, thereby filling the trench;
    planarizing the structure to the top of the level of the portion of the second polysilicon layer which is located in the trench; and
    completing the CMOS device, including LDD, halo, source/drain ion implantation, gate spacer formation, interlayer dielectric deposition, contact masking and etching, and metalization of electrodes.

11. The method of claim 10 wherein said preparing a substrate includes forming an N-well and a P-well in each device region.

12. The method of claim 11 wherein said forming an N-well and a P-well in each device region includes implanting phosphorus ions to form the N-well at a dose of about $2 \cdot 10^{13}$ cm$^{-2}$ to $5 \cdot 10^{14}$ cm$^{-2}$, at an energy level of 40 keV to 200 keV, and implanting boron ions to from the P-well at a dose of about $2 \cdot 10^{13}$ cm$^{-2}$ to $5 \cdot 10^{14}$ cm$^{-2}$, at an energy level of 20 keV to 80 keV.

13. The method of claim 10 wherein said forming a cap silicon layer includes forming a cap silicon layer to a thickness of between about 50 Å to 300 Å.

14. The method of claim 10 wherein said implanting H+ ions includes implanting H+ ions to a projected depth of between about 2 nm 100 nm below the SiGe:silicon interface.

15. The method of claim 14 wherein said implanting H+ ions includes implanting H+ ions at a dose of between about $1 \times 10^{16}$ cm$^{-2}$ to $4 \times 10^{16}$ cm$^{-2}$, and at an energy of between about 40 keV to 80 keV.

16. The method of claim 10 wherein said forming a trench is a single-step etch.

17. The method of claim 10 wherein said forming a trench is a two-step etch which includes etching the first polysilicon layer and then etching the underlying layers into the substrate.

18. A method of forming a CMOS device, comprising:

preparing a silicon substrate, including forming plural device regions on the substrate and includes an N-well and a P-well in each device region;

epitaxially forming a strained SiGe layer on the substrate, wherein the SiGe layer has a germanium content of between about 20% and 40% and a thickness of between about 2500 Å to 4000 Å;

forming a silicon cap layer epitaxially on the SiGe layer to a thickness of between about 50 Å to 300 Å;

depositing a gate oxide layer to a thickness of between about 10 Å and 60 Å;

depositing a first polysilicon layer;

implanting H+ ions to a depth of between about 2 nm to 100 nm below the SiGe layer at a dose of between about $1 \times 10^{16}$ cm$^{-2}$ to $4 \times 10^{16}$ cm$^{-2}$, and at an energy of between about 40 keV to 80 keV;

forming a trench by shallow trench isolation which extends into the substrate;

annealing the structure at a temperature of between about 700° C. to 900° C. for between about five minutes to sixty minutes;

depositing an oxide layer and a second polysilicon layer, thereby filling the trench;

planarizing the structure to the top of the level of the portion of the second polysilicon layer which is located in the trench; and completing the CMOS device.

19. The method of claim 18 wherein said forming an N-well and a P-well in each device region includes implanting phosphorus ions to form the N-well at a dose of about $2 \cdot 10^{13}$ cm$^{-2}$ to $5 \cdot 10^{14}$ cm$^{-2}$, at an energy level of 40 keV to 200 keV, and implanting boron ions to from the P-well at a dose of about $2 \cdot 10^{13}$ cm$^{-2}$ to $5 \cdot 10^{14}$ cm$^{-2}$, at an energy level of 20 keV to 80 keV.

20. The method of claim 18 wherein said forming a trench is a single-step etch.

21. The method of claim 18 wherein said forming a trench is a two-step etch which includes etching the first polysilicon layer and then etching the underlying layers into the substrate.

* * * * *